(12) United States Patent
Chang

(10) Patent No.: US 6,806,535 B2
(45) Date of Patent: Oct. 19, 2004

(54) NON-VOLATILE MEMORY AND FABRICATING METHOD THEREOF

(75) Inventor: Ching-Yu Chang, Yilan Hsien (TW)

(73) Assignee: Macronix International Co., Ltd., Hsinchu (TW)

( * ) Notice: Subject to any disclaimer, the term of this patent is extended or adjusted under 35 U.S.C. 154(b) by 55 days.

(21) Appl. No.: 10/248,467

(22) Filed: Jan. 22, 2003

(65) Prior Publication Data

US 2004/0140509 A1 Jul. 22, 2004

(51) Int. Cl.[7] ................... H01L 29/76; H01L 29/94; H01L 31/062; H01L 31/113; H01L 31/119
(52) U.S. Cl. ............ 257/340; 257/231; 257/278; 257/331; 257/341; 257/390; 257/391; 257/401
(58) Field of Search ..................... 257/390–391, 257/231, 278, 331, 341, 401, 340

(56) References Cited

U.S. PATENT DOCUMENTS

| 5,397,908 | A | * | 3/1995 | Dennison et al. | ........... 257/306 |
| 6,479,864 | B1 | * | 11/2002 | Ko | ........... 257/347 |
| 6,504,201 | B1 | * | 1/2003 | Noble et al. | ........... 257/302 |
| 6,528,837 | B2 | * | 3/2003 | Forbes et al. | ........... 257/302 |
| 6,541,828 | B2 | * | 4/2003 | Chang | ........... 257/390 |
| 6,756,268 | B2 | * | 6/2004 | Rudeck et al. | ........... 438/257 |
| 2001/0035589 | A1 | * | 11/2001 | Kim | ........... 257/910 |
| 2002/0000592 | A1 | * | 1/2002 | Fujiwara | ........... 257/296 |
| 2002/0158282 | A1 | * | 10/2002 | Li et al. | ........... 257/297 |
| 2004/0097008 | A1 | * | 5/2004 | Leedy | ........... 438/108 |

* cited by examiner

Primary Examiner—Michael Trinh
Assistant Examiner—Ida M. Soward
(74) Attorney, Agent, or Firm—Jiang Chyun IP Office

(57) ABSTRACT

A method of fabricating a non-volatile memory is provided. A longitudinal strip of stacked layer is formed over a substrate. The longitudinal strip is a stacked layer including a gate dielectric layer, a conductive layer and a cap layer. A buried bit line is formed in the substrate on each side of the longitudinal strip. The longitudinal strip is patterned to form a plurality of stacked blocks. Thereafter, a dielectric layer is formed over the substrate. The dielectric layer exposes the cap layer of the stacked blocks. Some cap layers of the stacked blocks are removed to expose the conductive layer underneath. A word line is formed over the dielectric layer to connect stacked blocks in the same row serially together.

5 Claims, 4 Drawing Sheets

NON-VOLATILE MEMORY AND FABRICATING METHOD THEREOF

BACKGROUND OF INVENTION

1. Field of Invention

The present invention relates to a non-volatile memory and fabricating method thereof. More particularly, the present invention relates to a mask read-only-memory (mask ROM) and fabricating method thereof.

2. Description of Related Art

Most mask read-only-memory (mask ROM) has a structure that includes a plurality of bit lines (BL) and a plurality of word lines (WL) that cross over the bit lines.

Underneath the word lines and between two neighboring bit lines, there is a memory cell channel region. For some mask ROM, a data value of "1" or "0" is stored according to whether ions are implanted into the channel layer or not. The process of implanting ions into the specified channel regions is often referred to as a code implant process.

The code implant process of a mask ROM includes patterning a photoresist layer on a substrate using a photomask to expose the code implant regions and then conducting an ion implantation to implant ions into the designated regions using the patterned photoresist layer as a mask. However, the photomask that serves as a coding mask in the code implant process may contain single isolated patterns as well as dense patterns. During the transfer of pattern to the photoresist by photo-exposure, intensity of illumination on single isolated patterns will be weaker than intensity of illumination on dense patterns. Hence, deviation in critical dimension between dense pattern regions and isolated pattern regions due to optical proximity effect (OPE) can be considerable. Therefore, the code implant regions in the mask ROM may have non-uniform dimension leading to a misalignment of implanted ions in the channel implant process. Ultimately, wrong data may be programmed into the read-only-memory cells.

To reduce the difference in critical dimension in the mask ROM due to coexistence of dense and isolated pattern regions within the same photomask, technique such as an optical proximity correction (OPC) or a phase shift mask (PSM) is deployed. The optical proximity correction method utilizes a complementary pattern design to eliminate critical dimension deviation caused by proximity effect. However, to deploy the OPC method, a photomask with specialized pattern must be designed. Thus, aside from spending more time to fabricate the photomask, the photomask is more difficult and costly to fabricate. Furthermore, debugging any defects on the photomask pattern after fabrication is very difficult.

In addition, if the coding mask used for coding implant is misaligned or contains some deviation in critical dimension, coding ions originally intended for the designated implant regions may diffuse into the buried bit lines leading to a change in ion concentration. Consequently, there may be a considerable reduction in the current flowing through the buried bit line.

SUMMARY OF INVENTION

Accordingly, one object of the present invention is to provide a mask read-only-memory (mask ROM) structure and fabricating method thereof that prevents coding ions from diffusing into a buried bit line and leads to a considerable reduction in current flowing through the buried bit line during operation.

A second object of this invention is to provide a mask read-only-memory structure and a fabricating method thereof that prevents the production of non-uniform critical dimensions in a code implant region having both isolated patterns and dense patterns after memory coding as in a conventional code implant process.

A third object of this invention is to provide a mask read-only-memory structure and fabricating method thereof capable of coding the mask ROM with great precision without using optical proximity or phase shift mask technique, thereby lowering cost of production.

To achieve these and other advantages and in accordance with the purpose of the invention, as embodied and broadly described herein, the invention provides a method of fabricating a non-volatile memory. A longitudinal strip of stacked layer is formed over a substrate. The longitudinal strip is a stacked layer comprising a gate dielectric layer, a conductive layer and a cap layer. A buried bit line is formed in the substrate on each side of the longitudinal strip. The longitudinal strip is patterned in a direction perpendicular to the buried bit line to form a plurality of stacked blocks. Thereafter, a dielectric layer is formed over the substrate. The dielectric layer exposes the cap layer of the stacked blocks. A code-masking layer is formed over the dielectric layer. The code-masking layer includes openings for isolated pattern regions and openings for dense pattern regions that expose a portion of the cap layer of the stacked blocks. Due to optical proximity effect, both the isolated pattern region openings and the dense pattern region openings have deviation in some critical dimensions. Using the code-masking layer as an etching mask, the cap layers of some stacked blocks are removed to expose the conductive layer underneath. The cap layer is removed by conducting an anisotropic etching operation. Although the critical dimension of the opening in the code-masking layer is non-uniform, the ultimately formed memory device in this invention is little affected by the non-uniform critical dimension because the anisotropic etching step removes the cap layer of the stacked blocks smoothly and completely. In addition, the cap layer over the stacked blocks need not be completely removed in the anisotropic etching process as long as a portion of the underlying conductive layer of the stacked blocks is exposed for connecting with a subsequently formed word line. The code-masking layer is next removed and then a word line is formed over the dielectric layer so that stacked blocks in the same row are serially connected to form a plurality of coding memory cells. Among these coding memory cells, the ones having electrical connection between the word line and the conductive layer is in a first logic state and the ones having no electrical connection between the word line and the conductive layer is in a second logic state.

This invention also provides a non-volatile memory structure. The non-volatile memory includes a substrate, a buried bit line, a plurality of first stacked blocks, a plurality of second stacked blocks and dielectric layer and a word line. The buried bit line is embedded within the substrate. The first stacked blocks are positioned on the substrate. Each first stack blocks is a stack that includes a cap layer, a conductive layer and a gate dielectric layer. The second stacked blocks are also positioned on the substrate. Each second stacked block is a stack that includes a conductive layer and a gate dielectric layer. The dielectric layer is on the substrate for electrically isolating the first stacked blocks and the second stacked blocks. The word line is positioned over the dielectric layer so that the first stacked blocks and the second stacked blocks along the same row are serially connected together to form a plurality of coding memory cells. Among the coding memory cells, the ones having a first stacked block is in a first data state and the ones having a second stacked block is in a second data state.

The mask ROM coding method according to this invention utilizes the connectivity between the word line and a conductive layer instead of a conventional code implant process to code the memory device. Hence, non-uniform dimensions in the code implant region within a memory device caused by a non-uniformity of critical dimensions between the isolated pattern region and the dense pattern region within a code-masking layer is prevented.

Because the mask ROM coding method according to this invention is not based on the conventional code implant process, the diffusion of coding ions into the buried bit line will not occur. In other words, current reduction within the buried bit line due the diffusion of coding ions no longer is a problem in this invention.

Furthermore, two sets of photomask designs each having a different line/pitch pattern are used to form the stacked blocks. Hence, dimension of the stacked blocks can be reduced to about 0.12 µm. In other words, critical dimension of the memory device can be reduced to about 0.12 µm.

Since the coding process according to this invention does not involve the use of complicated optical proximity correction or phase shift mask technique, cost for producing mask ROM is reduced considerably.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1A:
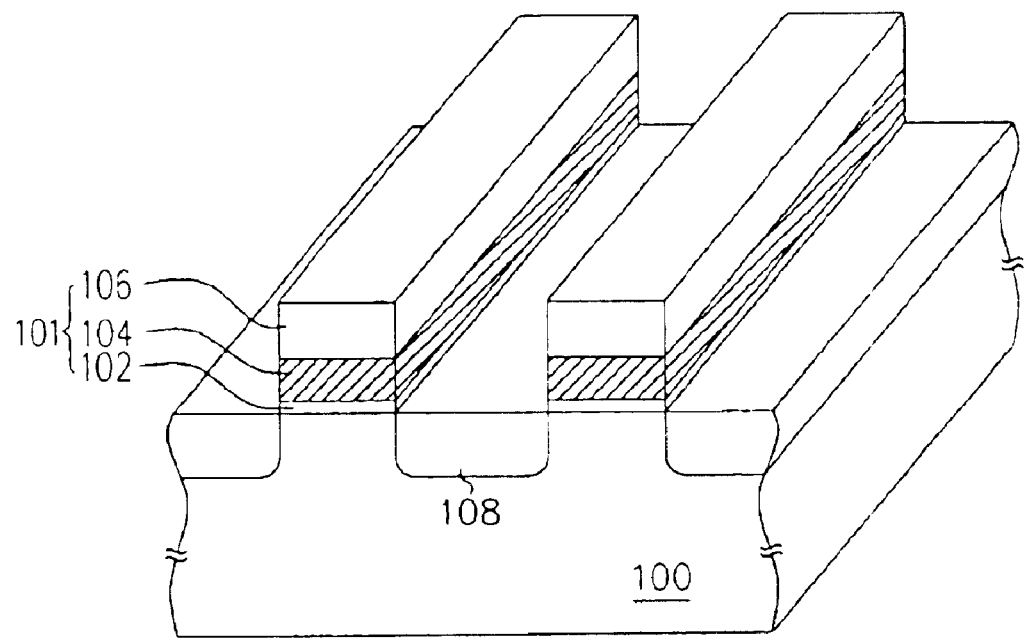
FIGS. 1A to 1F are perspective cross-sectional views showing the progression of steps for producing a mask read-only-memory according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1F are perspective cross-sectional views showing the progression of steps for producing a mask read-only-memory according to one preferred embodiment of this invention. As shown in FIG. 1A, a longitudinal strip of stacked layer 101 is formed over a substrate 100. The longitudinal strip is a stack comprising of a gate dielectric layer 102, a conductive layer 104 and a cap layer 106. In this embodiment, the substrate is a P-type silicon substrate, the gate dielectric layer 102 is a gate oxide layer, the conductive layer 104 is a polysilicon layer and the cap layer 106 is a silicon oxide layer, for example. The longitudinal strip is formed, for example, by sequentially forming a thin oxide layer, a polysilicon layer and a silicon oxide layer over the substrate 100 and then patterning them by conducting photolithographic and etching processes.

Thereafter, using the longitudinal layer 101 as an implant mask, an ion implantation is carried out to form a buried bit line 108 in the substrate 100 on each side of the longitudinal strip 101. The buried bit line 108 is an N-doped region, for example. Since the buried bit line 108 is formed using the longitudinal strip 101 as a mask, the buried bit line 108 is self-aligned.

Figure 1B:
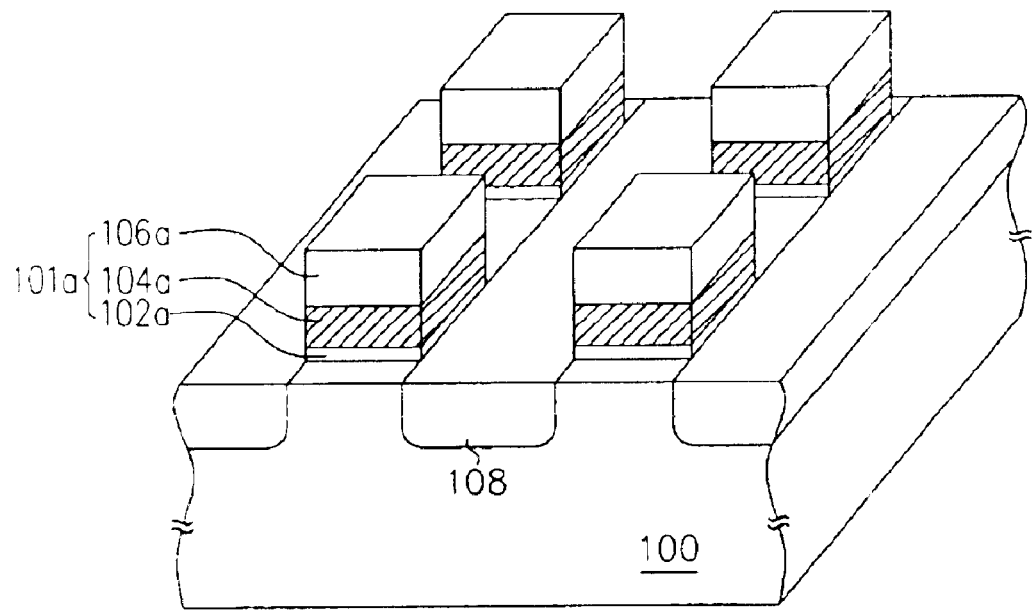

As shown in FIG. 1B, the longitudinal strip 101 is patterned in a direction perpendicular to the buried bit line 108 to form a plurality of stacked blocks 101a. The longitudinal layer 101 is patterned, for example, by conducting photolithographic and etching processes. In the patterning step, only the cap layer 106 and the conductive layer 104 need to be patterned. However, the cap layer 106, the conductive layer 104 and the gate dielectric layer 102 may be patterned together to form the stacked block 101a having a cap layer 106a, a conductive layer 104a and a gate dielectric layer 102a (or 102). The conductive layer 104a in the stacked block 101a serves as a gate.

Note that the stacked blocks 101a are patterned using two sets of photomasks each having a different line/pitch pattern. Hence, a stacked block with dimension as small as 0.12 µm is easily fabricated using a 248 photo-exposure light source.

Figure 1C:
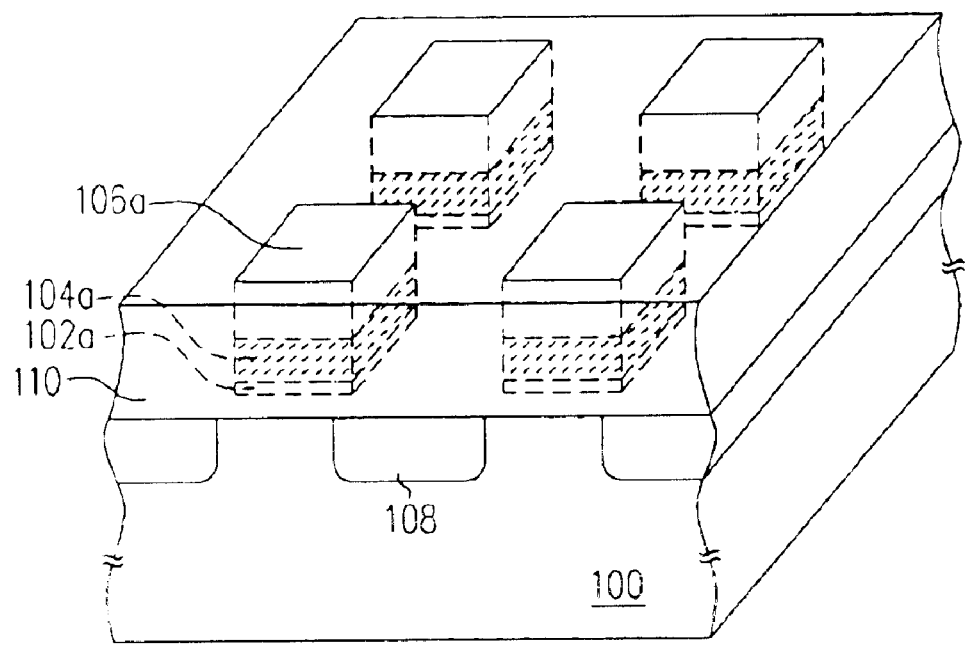

As shown in FIG. 1C, a dielectric layer 110 is formed over the substrate 100 such that the cap layers 106a of the stacked blocks 110a are exposed. The dielectric layer 110 is formed, for example, by depositing dielectric material over the substrate to cover the stacked blocks 101a and then etching back or removing a portion of the dielectric layer through chemical-mechanical polishing until the cap layers 106a are exposed. Etching rate differs between the dielectric layer 110 and the cap layer 106a. That is, the dielectric layer 110 has an etching rate smaller than the cap layer 106a. Hence, if the cap layer 106a is a silicon oxide layer, the dielectric layer 110 is a silicon nitride layer.

Figure 1D:
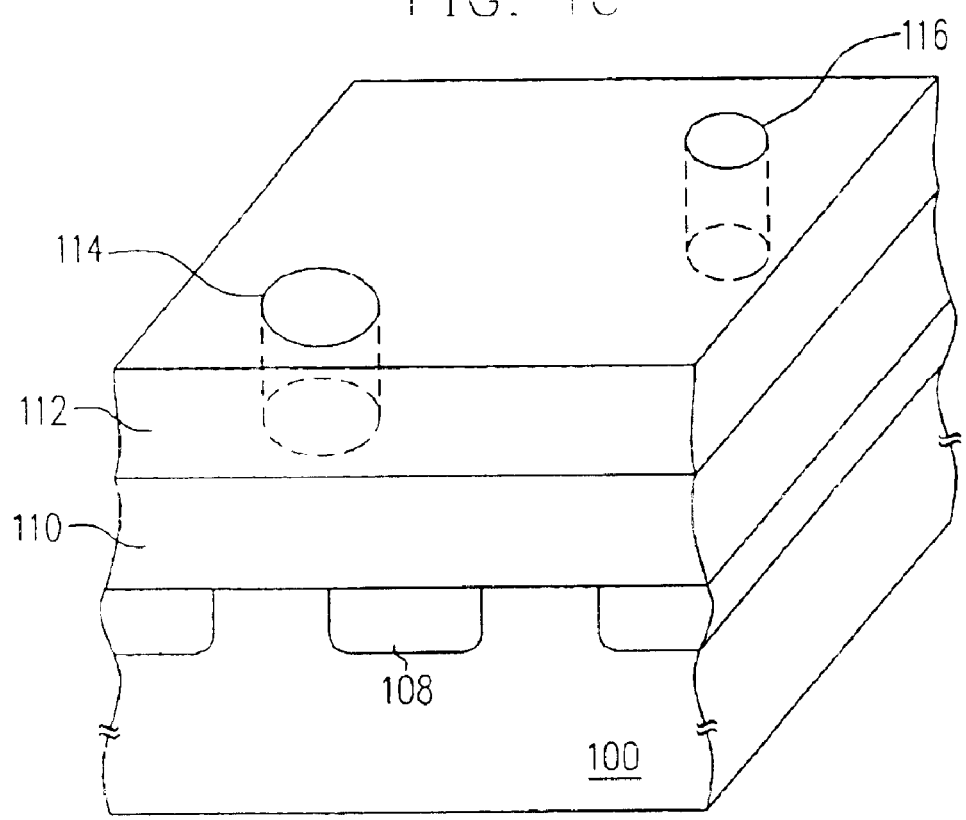
Figure 2:
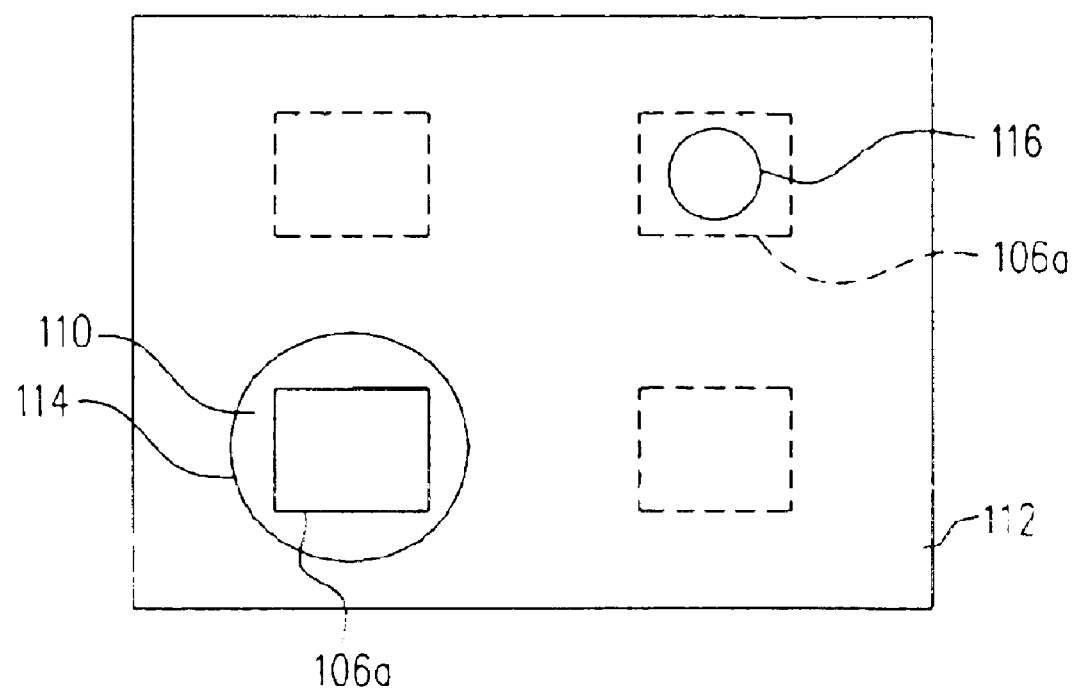
FIG. 2 is a top view of the structure shown in FIG. 1D.

As shown in FIG. 1D, a code-masking layer 112 is formed over the dielectric layer 110. The code-masking layer 112 has a dense pattern region opening 114 and an isolated patterned region opening 116 that exposes a portion of the cap layer 106a of the stacked blocks 110a. FIG. 2 is a top view of the coding-mask layer 112. In the photolithographic process for forming the code-masking layer 112, strength of exposure in the isolated pattern region is much weaker than the dense pattern region. Due to optical proximity effect between the dense pattern opening 114 and the isolated pattern opening 116, critical dimensions may deviate leading to the production of openings having a non-uniform dimension.

Thereafter, using the code masking layer 112 as an etching mask, an etching is conducted to remove the exposed cap layers 106a. The cap layer 106a is removed, for example, by conducting an anisotropic etching. The anisotropic etching can be a dry etching process (the etchant is gases) or a wet etching process (the etchant is liquids). In this embodiment, the etchant used in the anisotropic etching operation includes, for example, buffered oxide etching (BOE) solution or hydrofluoric (HF) acid and so on.

Although the critical dimension of the openings 114, 116 in the code-masking layer 112 is non-uniform, the ultimately formed memory device in this invention is little affected by the non-uniform critical dimension. This is because coding is achieved by removing the cap layers 106a of the stacked blocks 101a in an anisotropic etching process instead of a code implant process.

Note that even if the cap layer 106a of the stacked block 101a is only partially exposed by the isolated pattern region opening 116, the anisotropic etching is still able to remove the cap layers 106a inside the opening 114. In addition, the cap layer 106a over the stacked blocks 101a within the opening 114 need not be completely removed in the anisotropic etching process as long as a portion of the underlying conductive layer of the stacked blocks is exposed for connecting with a subsequently formed word line.

Furthermore, the dense pattern opening 114 in the code-masking layer 112 may expose a portion of the dielectric layer 110 around the stacked block 101a aside from exposing the cap layer 106a. However, due to an etching selectivity between the cap layer 106a and the dielectric layer 110, only the cap layer 106a will be removed in the etching operation.

Figure 1E:
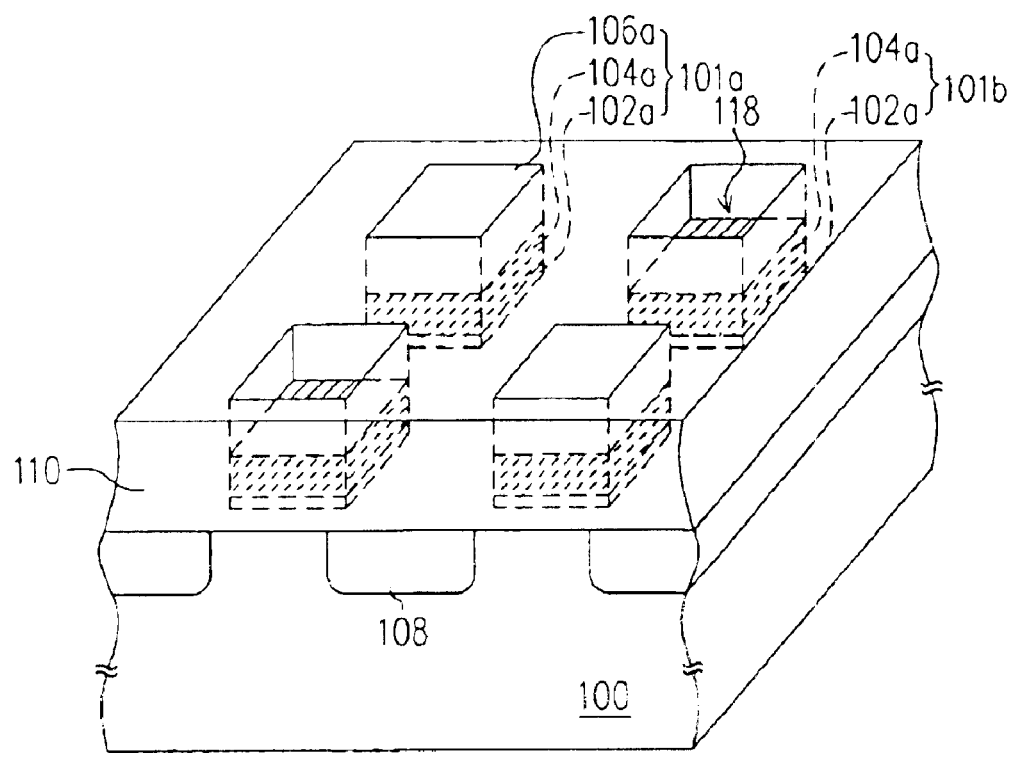

As shown in FIG. 1E, the code-masking layer 112 is removed by etching to expose the dielectric layer 110. After the etching step, the stacked blocks 101a whose cap layer 106a is removed become stacked blocks 101b. Each stack block 101b is a stack having a conductive layer 104a and a gate dielectric layer 102a (or 102) only. An opening 118 is formed in the dielectric layer 110 where the cap layer 106a has already been removed. The opening 118 exposes the conductive layer 104a of the stacked block 101b.

Figure 1F:
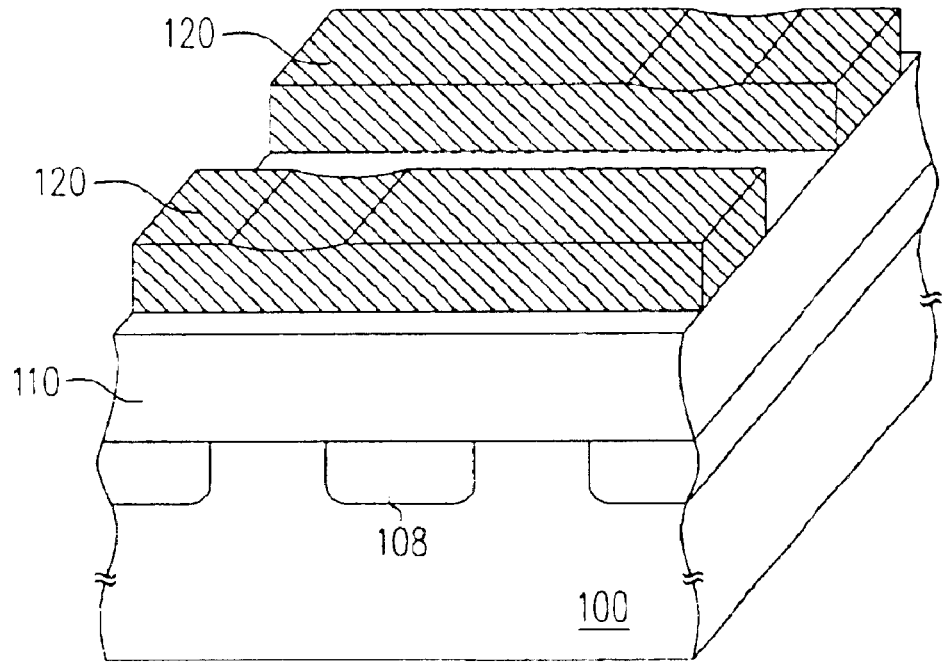

As shown in FIG. 1F, a word line 120 is formed over the dielectric layer 110 serially connecting the stacked blocks 101a, 101b in the same row to form a plurality of coding memory cells. Among the coding memory cells, the one having electrical connection (having a stacked block 101b) between the word line 120 and the conductive layer (the gate) 104a is in a first data state. On the other hand, the coding memory cells having no electrical connection (having a stacked block 101a) between the word line 120 and the conductive layer (the gate) is in a second data state.

The non-volatile memory structure according to this invention includes a substrate 100, a buried bit line 108, a plurality of first stacked blocks 101a, a plurality of second stacked blocks 101b, a dielectric layer 110 and a word line 120. The buried bit line 108 is embedded within the substrate 100. The first stacked blocks 101a are positioned on the substrate 100. Each first stack blocks 101a is a stack that includes a cap layer 106a, a conductive layer 104a and a gate dielectric layer 102a. The second stacked blocks 101b are also positioned on the substrate 100. Each second stacked block 101b is a stack that includes a conductive layer 104a and a gate dielectric layer 102a. The dielectric layer 110 is on the substrate 100 for electrically isolating the first stacked blocks 101a and the second stacked blocks 101b. The word line 120 is positioned over the dielectric layer 110 so that the first stacked blocks 101a and the second stacked blocks 101b along the same row are serially connected together to form a plurality of coding memory cells. Among the coding memory cells, the ones having a first stacked block 101a is in a first data state and the ones having a second stacked block 101b is in a second data state.

The mask ROM coding method according to this invention utilizes the connectivity between the word line and the conductive layer instead of a conventional code implant process to code the memory device. Hence, non-uniform dimensions in the code implant region within a memory device caused by a non-uniformity of critical dimensions between the isolated pattern region and the dense pattern region within a code-masking layer is prevented.

Because the mask ROM coding method according to this invention is not based on the conventional code implant process, the diffusion of coding ions into the buried bit line will not occur. In other words, current reduction within the buried bit line due the diffusion of coding ions no longer is a problem in this invention.

Furthermore, two sets of photomask designs each having a different line/pitch pattern are used to form the stacked blocks. Hence, dimension of the stacked blocks can be reduced to about 0.12 μm. In other words, critical dimension of the memory device can be reduced to about 0.12 μm.

Since the coding process according to this invention does not involve the use of complicated optical proximity correction or phase shift mask technique, cost for producing mask ROM is reduced considerably.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A non-volatile memory structure, comprising:

a substrate;

a buried bit line within the substrate;

a plurality of first stacked blocks on the substrate, wherein each first stacked block is a stack having a cap layer, a conductive layer and a gate dielectric layer;

a plurality of second stacked blocks on the substrate, wherein each second stacked block is a stack having a conductive layer and a gate dielectric layer;

a dielectric layer over the substrate for isolating the first stacked blocks and the second stacked blocks; and a word line over the dielectric layer for connecting stacked blocks in the same row serially to form a plurality of coding memory cells, wherein the coding memory cells having a first stacked block is in a first data state and the coding memory cells having a second stacked block is in a second data state.

2. The structure of claim 1, wherein material constituting the cap layer includes silicon oxide.

3. The structure of claim 1, wherein material constituting the dielectric layer includes silicon nitride.

4. The structure of claim 1, wherein material constituting the word line includes metallic substance or polysilicon.

5. The structure of claim 1, wherein material constituting the conductive material includes polysilicon.

* * * * *